United States Patent
Park et al.

(10) Patent No.: US 10,444,292 B2
(45) Date of Patent: Oct. 15, 2019

(54) BATTERY MANAGEMENT APPARATUS AND METHOD

(71) Applicant: Samsung Electronics Co., Ltd., Suwon-si (KR)

(72) Inventors: Sang Do Park, Seoul (KR); Duk Jin Oh, Seoul (KR); Kae Weon You, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 86 days.

(21) Appl. No.: 15/381,255

(22) Filed: Dec. 16, 2016

(65) Prior Publication Data

US 2017/0205468 A1 Jul. 20, 2017

(30) Foreign Application Priority Data

Jan. 14, 2016 (KR) .......................... 10-2016-0004907

(51) Int. Cl.
*G01R 31/374* (2019.01)
*H01M 10/48* (2006.01)
*G01R 31/392* (2019.01)
*G01R 31/396* (2019.01)
*H01M 10/42* (2006.01)

(52) U.S. Cl.
CPC ......... *G01R 31/374* (2019.01); *G01R 31/392* (2019.01); *G01R 31/396* (2019.01); *H01M 10/425* (2013.01); *H01M 10/48* (2013.01); *H01M 10/486* (2013.01)

(58) Field of Classification Search
None
See application file for complete search history.

(56) References Cited

U.S. PATENT DOCUMENTS

| | | | |
|---|---|---|---|
| 5,598,087 A * | 1/1997 | Hara | B60L 11/1862 320/DIG. 21 |
| 6,512,350 B1 * | 1/2003 | Bernard | H02J 7/0091 320/150 |
| 8,332,342 B1 | 12/2012 | Saha et al. | |
| 2002/0093312 A1 * | 7/2002 | Choo | G01R 31/3624 320/149 |

(Continued)

FOREIGN PATENT DOCUMENTS

| | | |
|---|---|---|
| JP | 2015-141117 A | 8/2015 |
| KR | 10-2007-0076833 A | 7/2007 |
| KR | 10-2011-0096431 A | 8/2011 |

OTHER PUBLICATIONS

Tanim, Tanvir R., et al. "State of charge estimation of a lithium ion cell based on a temperature dependent and electrolyte enhanced single particle model." Energy 80 (2015): 731-739. (9 pages in English).

*Primary Examiner* — Patrick Assouad
*Assistant Examiner* — Demetrius R Pretlow
(74) *Attorney, Agent, or Firm* — NSIP Law

(57) ABSTRACT

A battery management apparatus and method to estimate a state of a battery is provided. The battery management apparatus includes a processor configured to collect battery information, to estimate a residual capacity of a battery at an operating temperature based on the collected battery information, to convert the estimated residual capacity of the battery into a capacity of the battery at a reference temperature, and to estimate a state of health (SOH) of the battery based on the converted capacity.

17 Claims, 8 Drawing Sheets

(56) References Cited

U.S. PATENT DOCUMENTS

| | | | |
|---|---|---|---|
| 2006/0176022 A1* | 8/2006 | Namba | G01R 31/3651 320/130 |
| 2008/0254347 A1* | 10/2008 | Palladino | H01M 10/48 429/90 |
| 2009/0295334 A1* | 12/2009 | Yang | H02J 7/0031 320/134 |
| 2010/0182157 A1* | 7/2010 | Shaffer | H04Q 9/00 340/636.13 |
| 2011/0077879 A1 | 3/2011 | Paryani | |
| 2013/0069658 A1* | 3/2013 | Rich | H01M 10/48 324/426 |
| 2013/0166234 A1 | 6/2013 | Chou et al. | |
| 2016/0146895 A1* | 5/2016 | Yazami | B60L 1/003 324/426 |
| 2016/0285136 A1* | 9/2016 | Abe | H01M 10/42 |
| 2016/0336767 A1* | 11/2016 | Zane | H02J 7/0021 |
| 2017/0016961 A1* | 1/2017 | Lucea | B60L 11/1862 |

* cited by examiner

FIG. 2

| TEMPERATURE (°C) | 25 | 45 | 60 |
|---|---|---|---|
| BATTERY CAPACITY (mAh) | 2600 | 2810 | 2900 |
| | 2700 | 2900 | 2950 |
| | 2800 | 2980 | 3050 |
| | ... | ... | ... |

BATTERY MANAGEMENT APPARATUS AND METHOD

CROSS-REFERENCE TO RELATED APPLICATION(S)

This application claims the benefit under 35 U.S.C. § 119(a) of Korean Patent Application No. 10-2016-0004907, filed on Jan. 14, 2016, in the Korean Intellectual Property Office, the entire disclosure of which is incorporated herein by reference for all purposes.

BACKGROUND

1. Field

The following description relates to battery management apparatuses and methods for estimating a state of a battery.

2. Description of Related Art

A state of health (SOH) of a battery may be measured or estimated using an increase of an internal resistance and a capacity fading.

For example, when being estimated based on a capacity fading, an SOH of a battery may be estimated from a percentage of a value obtained by dividing a current capacity, "$Capacity_t$," of the battery by an initial capacity, "$Capacity_{init}$," of the battery.

In another example, when using an internal resistance to estimate an SOH of a battery, the SOH may be estimated by estimating a direct current (DC) impedance to determine an aging degree of the battery. Here, the internal resistance may be obtained by applying Ohm's law using a charging time required in a fixed voltage and current section.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, there is provided a method for standardizing a residual capacity of a battery by considering an operating temperature of a battery, and estimating an SOH of the battery from the standardized battery capacity.

In one general aspect, there is provided a battery management apparatus including a processor configured to collect battery information, estimate a residual capacity of a battery at an operating temperature based on the collected battery information, convert the estimated residual capacity of the battery into a capacity of the battery at a reference temperature, and estimate a state of health (SOH) of the battery based on the converted capacity.

The processor may include a battery information collector configured to collect the battery information, a capacity estimator configured to estimate the residual capacity of the battery at the operating temperature based on the collected battery information, a capacity converter configured to convert the estimated residual capacity of the battery into the capacity of the battery at a reference temperature, and an SOH estimator configured to estimate the SOH of the battery based on the converted capacity.

The battery information may include any one or any combination of a temperature, a current, and a voltage that are measured in a cell unit or a module unit of the battery.

The capacity estimator may be configured to determine any one or any combination of an average value, a median value, a maximum value, and a minimum value of the temperature measured in the cell unit or the module unit of the battery as the operating temperature, and to estimate the residual capacity of the battery at the operating temperature.

The capacity converter may be configured to convert the estimated residual capacity of the battery at the operating temperature into the residual capacity of the battery at the reference temperature using capacity conversion information per temperature.

The capacity conversion information per temperature may include any one or any combination of a conversion table, a conversion function, and a conversion graph, each representing a capacity conversion relation of the reference temperature as compared to the operating temperature.

The battery management apparatus may include a pre-processor configured to eliminate noise from the collected battery information.

The pre-processor may be configured to selectively provide or exclude the collected battery information according to a state of the collected battery information.

The capacity conversion information per temperature may be learned in advance and may be stored in a capacity conversion information storage.

The battery management apparatus may include a memory configured to store instructions, and wherein the processor is further configured to execute the instructions to collect the battery information, to estimate the residual capacity of the battery at the operating temperature based on the collected battery information, to convert the estimated residual capacity of the battery into the capacity of the battery at a reference temperature, and to estimate the SOH of the battery based on the converted capacity.

In another general aspect there is provided a battery management method including collecting battery information, estimating a residual capacity of a battery at an operating temperature based on the collected battery information, converting the estimated residual capacity of the battery at the operating temperature into a capacity of the battery at a reference temperature, and estimating a state of health (SOH) of the battery based on the converted capacity.

The battery information may include any one or any combination of a temperature, a current, and a voltage that are measured in a cell unit or a module unit of the battery.

The estimating of the residual capacity of the battery may include determining any one or any combination of an average value, a median value, a maximum value, and a minimum value of the temperature measured in the cell unit or the module unit of the battery as the operating temperature, and estimating the residual capacity of the battery at the operating temperature.

The converting of the estimated residual capacity may include converting the estimated residual capacity of the battery at the operating temperature into the residual capacity of the battery at the reference temperature using capacity conversion information per temperature.

The capacity conversion information per temperature may include any one or any combination of a conversion table, a conversion function, and a conversion graph, each representing a capacity conversion relation of the reference temperature as compared to the operating temperature.

The battery management method may include pre-processing to eliminate noise from the collected battery information.

The battery may include battery cells and the estimating of the SOH of the battery may include estimating the SOH of the battery based on estimating a SOH of each cell of the battery at a reference temperature.

Other features and aspects will be apparent from the following detailed description, the drawings, and the claims.

BRIEF DESCRIPTION OF THE DRAWINGS

FIG. 2 is a diagram illustrating an example of a capacity conversion table per temperature.

Figure 1:
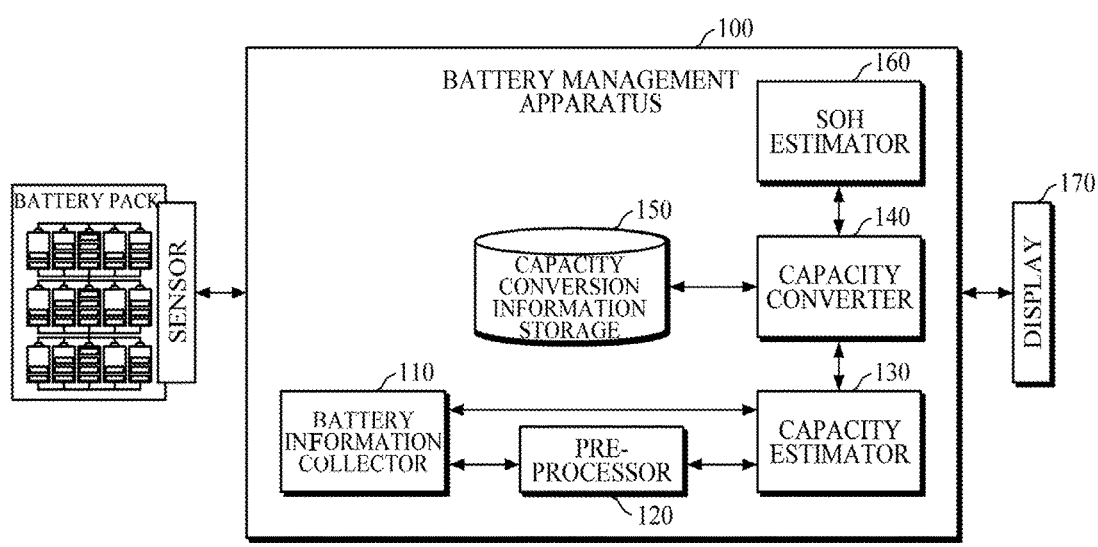
FIG. 1 is a diagram illustrating an example of a battery management apparatus 100.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods and/or apparatuses described herein. However, various changes, modifications, and equivalents of the methods and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, and/or apparatuses described herein that will be apparent after an understanding of the disclosure of this application.

FIG. 1 is a diagram of a battery management apparatus 100 according to an embodiment. With reference to FIG. 1, the battery management apparatus 100 includes a battery information collector 110, a pre-processor 120, a capacity estimator 130, a capacity converter 140, a capacity conversion information storage 150, a state of health (SOH) estimator 160, and a display 170.

In an example, the battery information collector 110 collects information sensed through sensors in a battery pack. For example, the battery information collector 110 may collect information such as temperature, current, voltage, which are measured in a unit of a battery cell or a battery module.

When the battery information is collected, the pre-processor 120 performs pre-processing to cleanse the collected battery information. In an example, the pre-processor 120 eliminates noise from the battery information by providing, for example, a noise filter for eliminating noise, a pre-processor for filtering a section having a predetermined current rate (C-rate) range of temperature data sensed from a sensor. In an example, the pre-processor 120 selectively pre-processes data according to a characteristic of the collected battery information. In an example, the pre-processor 120 selectively provides or excludes the pre-processed data from the battery management apparatus 100 according to a state of the collected battery information.

In an example, the capacity estimator 130 estimates a residual capacity of a battery at an operating temperature based on the collected battery information. For example, the capacity estimator 130 determines an operating temperature for estimating a residual capacity of the battery using temperature data measured in a cell unit or a module unit of the battery out of the collected battery information. As one example, at least one of an average value, a median value, a maximum value, and a minimum value of a temperature estimated in a cell unit or a module unit of the battery may be determined as an operating temperature.

According to an example, the capacity estimator 130 estimates a residual capacity (mAh) of a battery using battery charge/discharge data that is input through the battery information collector 110 or the pre-processor 120. For example, when temperature data inside a battery is sensed at the battery information collector 110 and a section having a C-rate of a low rate is filtered at the pre-processor 120, the capacity estimator 130 determines an average value that is obtained by averaging the pre-processed temperature data as an operating temperature of the battery.

In an example, unlike sensing data that senses the temperature data inside the battery, the battery operating temperature may be an average temperature in which sections that are temporarily raised or dropped in temperature are eliminated.

Although a battery capacity value estimated at 25° C. and a battery capacity value estimated at 45° C. are the same as each other, an amount of a current available from each of the battery capacity values when a battery is actually operated may be different. Consequently, when a state of a battery is estimated using an estimated residual capacity of the battery, an operating temperature of the battery may also be considered in estimating the residual capacity of the battery. The residual capacity of the battery may be increased or decreased according to an ambient temperature when the battery is operated. In a case of a battery pack configured with a plurality of battery cells, each of the battery cells may affect an operating temperature of an adjacent battery cell and a temporal rising and dropping of the operating temperature may affect an estimation of a residual capacity of the battery. When an SOH of a battery is estimated from a residual capacity thereof in such a temporal rising and dropping of a temperature, accuracy of an SOH estimation of the battery may be reduced.

In an example, the capacity converter 140 converts the residual capacity of the battery estimated at the operating temperature into a capacity of the battery at a reference temperature. For example, the capacity converter 140 converts the residual capacity of the battery estimated at the operating temperature into a residual capacity of the battery at the reference temperature using capacity conversion information per temperature.

In an example, the capacity conversion information per temperature is information having a form such as, for example, a conversion table, a conversion function, and a conversion graph, each of which represents a capacity conversion relation of a reference temperature compared to an operating temperature.

In an example, the capacity conversion information per temperature is conversion information that matches a residual capacity of a battery estimated at a test temperature to a residual capacity estimated at another test temperature, which enables an estimation of a state of the battery having a residual capacity to be the same as that estimated at the test temperature. As an example, when an SOH of a battery that is estimated based on a battery capacity of 2600 mAh at an operating temperature of the battery of 25° C. and an SOH of a battery that is estimated based on a battery capacity of 2800 mAh at a temperature of 45° C. are the same as each other, the battery capacity of 2600 mAh at 25° C. and the battery capacity of 2800 mAh at 45° C. are matched to each other.

In an example, the capacity conversion information per temperature is learned in advance or stored in the capacity conversion information storage 150. The capacity conversion information storage 150 may be built as a database. In addition, the battery management apparatus 100 may obtain capacity conversion information from an external side through an input interface implemented at the display 170.

The SOH estimator 160 may estimate an SOH of a battery based on the converted capacity. For example, the SOH estimator 160 may estimate an SOH of a battery using a data analysis method such as, for example, an equivalent circuit based internal resistance estimation, and an internal resistance estimation algorithm using an open circuit voltage (OCV).

According to an embodiment, when a residual capacity of a battery estimated at an operating temperature of the battery is converted into a residual capacity of the battery at a reference temperature, even though operating temperatures between the plurality of battery cells are minutely different from each other, a residual capacity of each battery cell may be compared as a unified index. Also, the SOH of the battery is estimated by actually considering the operating temperature of the battery so that accuracy of an SOH estimation of the battery may be improved. In an example, the residual capacity of the battery at a reference temperature is displayed on the display 170. In another example, an SOH of a battery based on the converted capacity is displayed on display 170.

In an example, the display 170 may be a physical structure that includes one or more hardware components that provide the ability to render a user interface and/or receive user input. The display 170 can encompass any combination of display region, gesture capture region, a touch sensitive display, and/or a configurable area. In an example, the display 170 can be embedded in the battery management apparatus 100. In an example, the display 170 is an external peripheral device that may be attached to and detached from the battery management apparatus 100. The display 170 may be a single-screen or a multi-screen display. A single physical screen can include multiple displays that are managed as separate logical displays permitting different content to be displayed on separate displays although part of the same physical screen. The display 170 may also be implemented as an eye glass display (EGD), which includes one-eyed glass or two-eyed glasses.

In an example, the battery management apparatus 100 may be embedded in or interoperate with various digital devices such as, for example, a mobile phone, a cellular phone, a smart phone, a personal computer (PC), a laptop, a notebook, a subnotebook, a netbook, or an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device or portable navigation device (PND), a handheld game console, an e-book, and devices such as a high definition television (HDTV), an optical disc player, a DVD player, a Blue-ray player, a setup box, robot cleaners, a home appliance, content players, communication systems, image processing systems, graphics processing systems, other consumer electronics/information technology (CE/IT) device, or any other device capable of wireless communication or network communication consistent with that disclosed herein. The digital devices may be embedded in or interoperate with a smart appliance, an intelligent vehicle, an electric vehicle, a hybrid vehicle, a smart home environment, or a smart building environment.

The digital devices may also be implemented as a wearable device, which is worn on a body of a user. In one example, a wearable device may be self-mountable on the body of the user, such as, for example, a ring, a watch, a pair of glasses, glasses-type device, a bracelet, an ankle bracket, a belt, a necklace, an earring, a headband, a helmet, a device embedded in the cloths, or as an eye glass display (EGD), which includes one-eyed glass or two-eyed glasses. In another non-exhaustive example, the wearable device may be mounted on the body of the user through an attaching device, such as, for example, attaching a smart phone or a tablet to the arm of a user using an armband, incorporating the wearable device in a cloth of the user, or hanging the wearable device around the neck of a user using a lanyard.

FIG. 2 illustrates an example of a capacity conversion table per temperature. According to an embodiment, the capacity conversion table per temperature is a look-up table, which matches and represents a residual capacity of the battery estimated at a specific operating temperature of a battery, and an operating temperature and a residual capacity of the battery which are equivalent to the specific operating temperature and the estimated residual capacity, respectively.

With reference to FIG. 2, in the capacity conversion table per temperature, a battery capacity per temperature and an equivalent battery capacity are reported by a temperature. For example, battery capacities of 2600 mAh, 2700 mAh, and 2800 mAh at an operating temperature of 25° C. may be matched to battery capacities of 2810 mAh, 2900 mAh, and 2980 mAh at an operating temperature of 45° C., respectively. In another example, the battery capacities of 2600 mAh, 2700 mAh, and 2800 mAh at an operating temperature of 25° C. is matched to battery capacities of 2900 mAh, 2950 mAh, and 3050 mAh at an operating temperature 60° C., respectively.

As one example, when determining a reference temperature as 25° C., the battery management apparatus 100 may convert a residual capacity of a battery estimated at another temperature into a residual capacity of the battery at the reference temperature based on the capacity conversion table per temperature.

In addition to the disclosed embodiment, a capacity conversion table having different parameters used in a temperature range, a battery capacity range, and a battery state estimation may be used without departing from the spirit and scope of the illustrative examples described.

Figure 3:
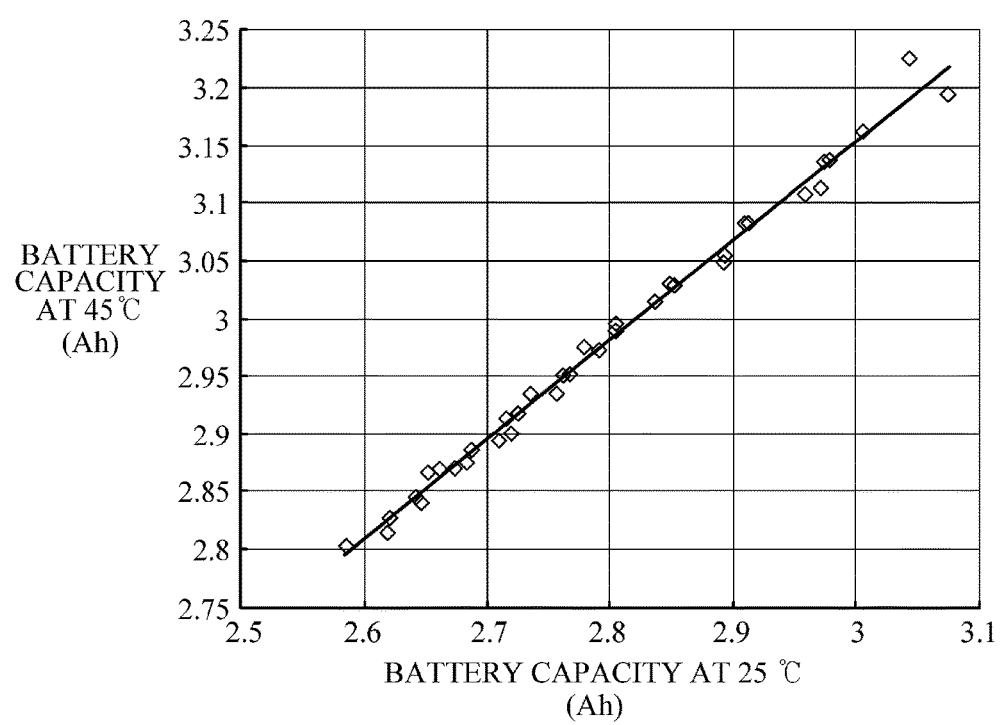
FIG. 3 illustrates an example of a capacity conversion graph between temperatures of 25° C. and 45° C.
Figure 4:
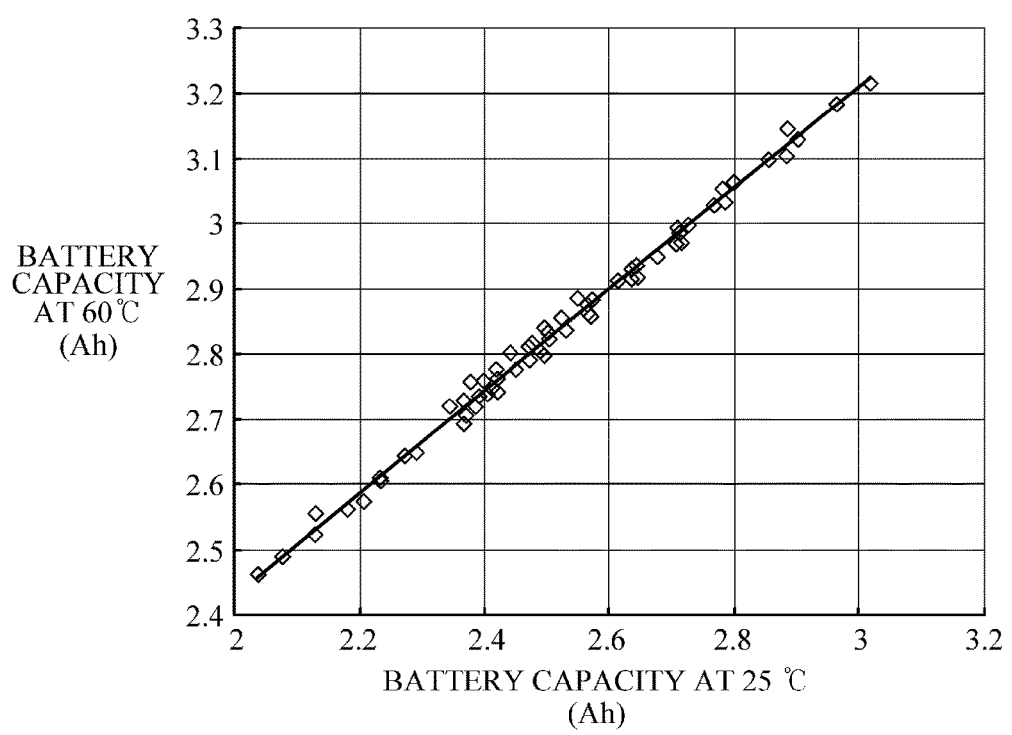
FIG. 4 illustrates an example of a capacity conversion graph between temperatures of 25° C. and 60° C.

FIGS. 3 and 4 illustrate examples of capacity conversion graphs between temperatures of 25° C. and 45° C., and between temperatures of 25° C. and 60° C., respectively. With reference to FIGS. 3 and 4, capacity conversion relationships between two temperatures are shown in a graph form on a two-dimensional plane.

For example, a battery capacity at a specific temperature and an equivalent battery capacity at another temperature are shown as a corresponding point on a two-dimensional plane, and a plurality of corresponding points are analyzed using a data analysis techniques to generate the capacity conversion graphs shown in FIGS. 3 and 4.

With reference to FIG. 3, when the battery management apparatus 100 determines a reference temperature as 25° C., a residual capacity 2.9 Ah of a battery at 45° C. may be converted into a battery capacity of 2.7 Ah at the reference temperature of 25° C. using the capacity conversion graph between temperatures of 25° C. and 45° C.

With reference with FIG. 4, the battery management apparatus 100 may convert a residual capacity of a battery at 60° C. into a battery capacity at 25° C. of the reference temperature using the capacity conversion graph between temperatures of 60° C. and 25° C.

Meanwhile, although not shown in the drawings, the capacity conversion information per temperature may be represented in a conversion function form. For example, the capacity conversion graphs shown in FIGS. 3 and 4 may be represented in a relation form.

In an example, a conversion function for converting a battery capacity at 45° C. into a battery capacity at 25° C. is expressed as $f(x)=-0.6391+1.1535x$. The variable x is a residual capacity of a battery estimated at 45° C. Similarly, a conversion function for converting a battery capacity at 60° C. into a battery capacity at 25° C. is expressed as $f(x)=-1.1248+1.2850x$. The variable x is a residual capacity of a battery estimated at 60° C.

Figure 5:
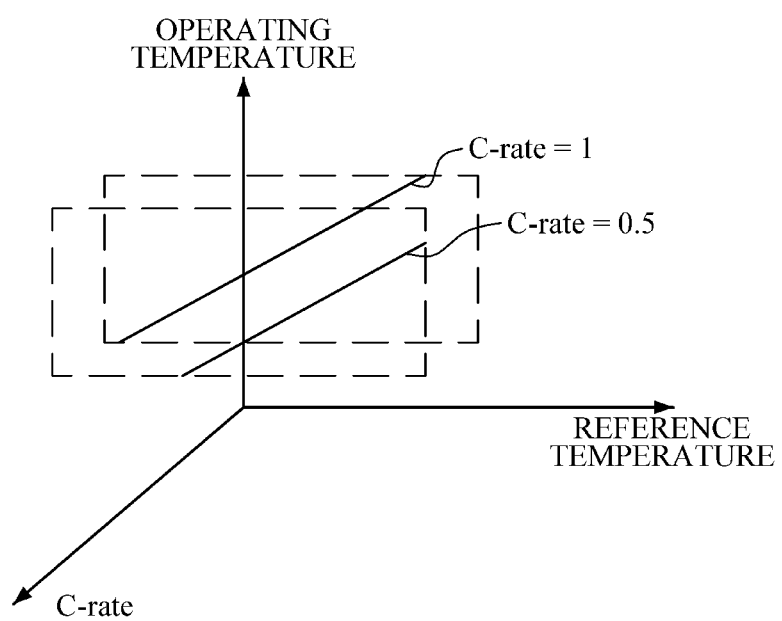
FIG. 5 illustrates an example of a capacity conversion graph per temperature by considering C-rate.

FIG. 5 is an example of a capacity conversion graph per temperature by considering a C-rate. Capacity conversion information includes not only an operating temperature of a battery and a reference temperature but also various other parameters as variables.

With reference to FIG. 5, the capacity conversion graph per temperature may be a graph on a three-dimensional plane having an x-axis of a reference temperature, a y-axis of an operating temperature, and a z-axis of a C-rate. Referring to FIG. 5, capacity conversion graphs per temperature in cases that a C-rate is 1 and 0.5 are shown on a graph representing a conversion relation between a residual capacity of a battery estimated at an operating temperature and a residual capacity of the battery at a reference temperature.

The battery management apparatus 100 converts a residual capacity of the battery at the reference temperature using the capacity conversion graph shown in FIG. 5 by considering the C-rate in association with a battery capacity estimated at an operating temperature.

Embodiments regarding capacity conversion information including other parameters, in addition to the C-rate, may be implemented in diverse forms, without departing from the spirit and scope of the illustrative examples described.

Figure 6:
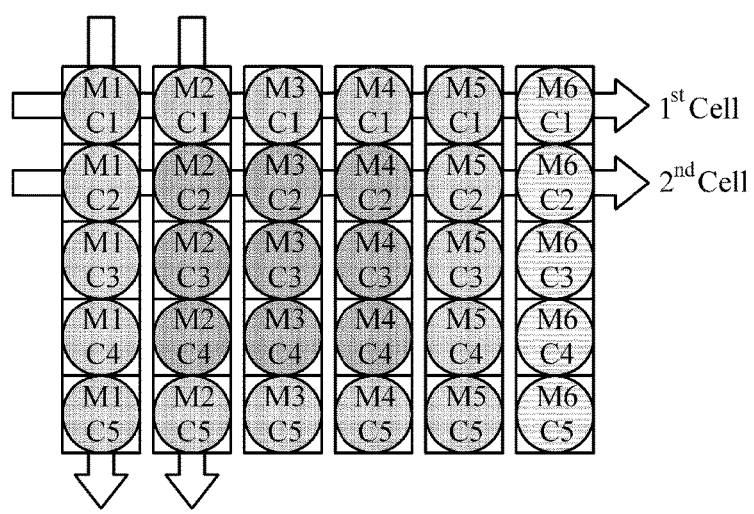
FIG. 6 is a diagram illustrating an example of an operating temperature of a battery pack including a plurality of battery cells.

FIG. 6 illustrates an example of an operating temperature of a battery pack including a plurality of battery cells. In a battery pack including a plurality of battery cells, even when a cooling system is operated on the battery pack, an operating temperature of each battery cell may be minutely different according to a position of each battery cell in relation to the cooling system.

With reference to FIG. 6, an average temperature distribution of a 6S5P battery may be different according to a position of each of battery cells. For example, heats of battery cells M2C2, M3C2, M4C2, M2C3, M3C3, M4C3, M2C4, M3C4, and M4C4, which are located at a center portion, may be difficult to be radiated into the external side, so that an operating temperature of each battery cell in the center may be higher than that of a neighboring cell which are located more towards the periphery. Also, an operating temperature of each battery cells M1C1, M2C1, M3C1, M4C1, M5C1, M1C2, M5C2, M1C3, M5C3, M1C4, M5C4, M1C5, M2C5, M3C5, M4C5, and M5C5 adjacent to the battery cells located at the center portion may be relatively lower than that of each of the battery cells located at the center portion. In addition, due to a position of the cooling system and an effect of other ambient temperature, an operating temperature of each of outer battery cells M6C1, M6C2, M6C3, M6C4, and M6C5 may be lower than that of each of the other adjacent battery cells. In addition to the disclosed embodiment, various other factors may determine an operating temperature of a battery cell.

According to one embodiment, when the operating temperature of each battery cell is different as shown in FIG. 6, the battery management apparatus 100 may perform a comparison of battery capacities of the plurality of battery cells by converting a residual capacity of a battery estimated at each battery cell into a residual capacity of a battery at a reference temperature, and may correct a battery capacity according to a difference of an operating temperature per each battery cell to estimate an SOH of the battery.

Figure 7:
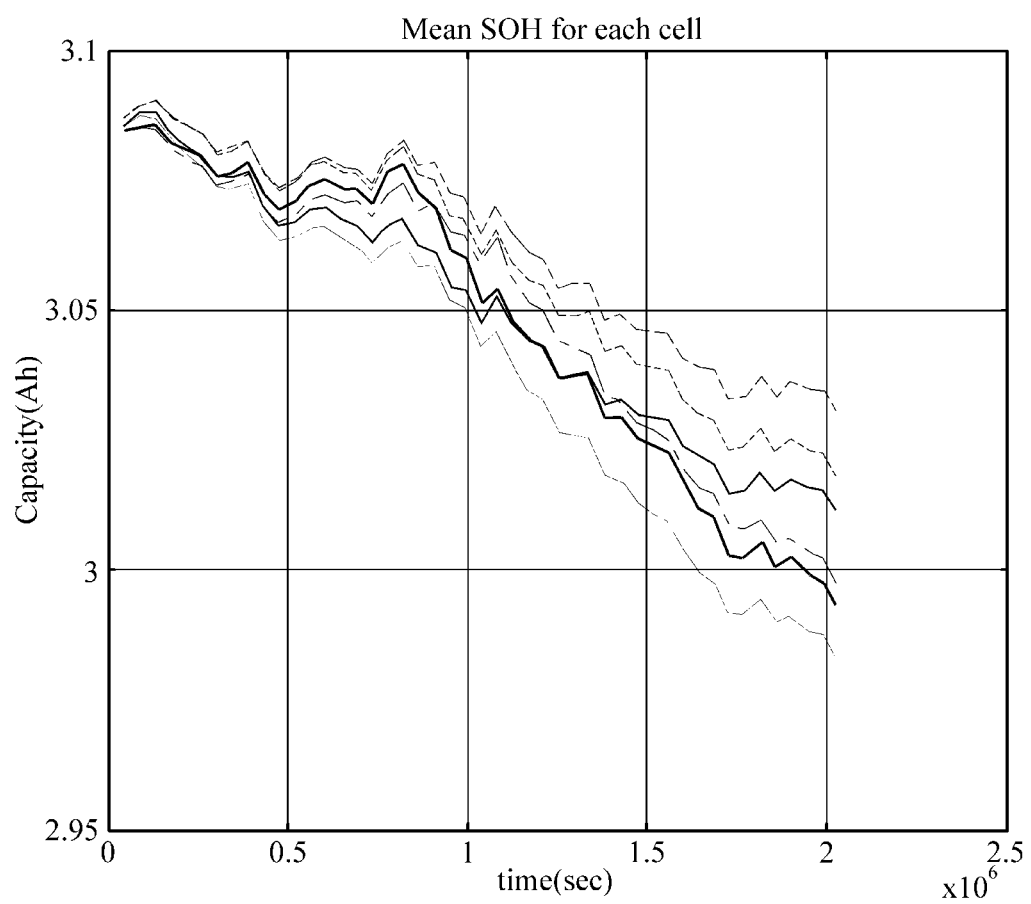
FIG. 7 shows an example of a graph illustrating a variation of an estimated residual capacity of each of the plurality of battery cells over time.

FIG. 7 shows an example of a graph illustrating a variation of an estimated residual capacity of each of the plurality of battery cells over time. With reference to FIG. 7, it can be seen that a difference between residual capacities estimated for the battery cells may be minute at an initial time but the difference may gradually increase over time. Such a difference of the residual capacity of the battery may inevitably degrade accuracy of an SOH estimation of the battery.

In a battery pack including a plurality of battery cells, an operating temperature of each battery cell may be affected by peripheral neighboring battery cells. The battery management apparatus 100 according to one embodiment corrects the difference of the operating temperature of each battery cell to convert into and manage a standard battery capacity at a reference temperature, and corrects an error of an SOH estimation of a battery from such operations.

Figure 8:
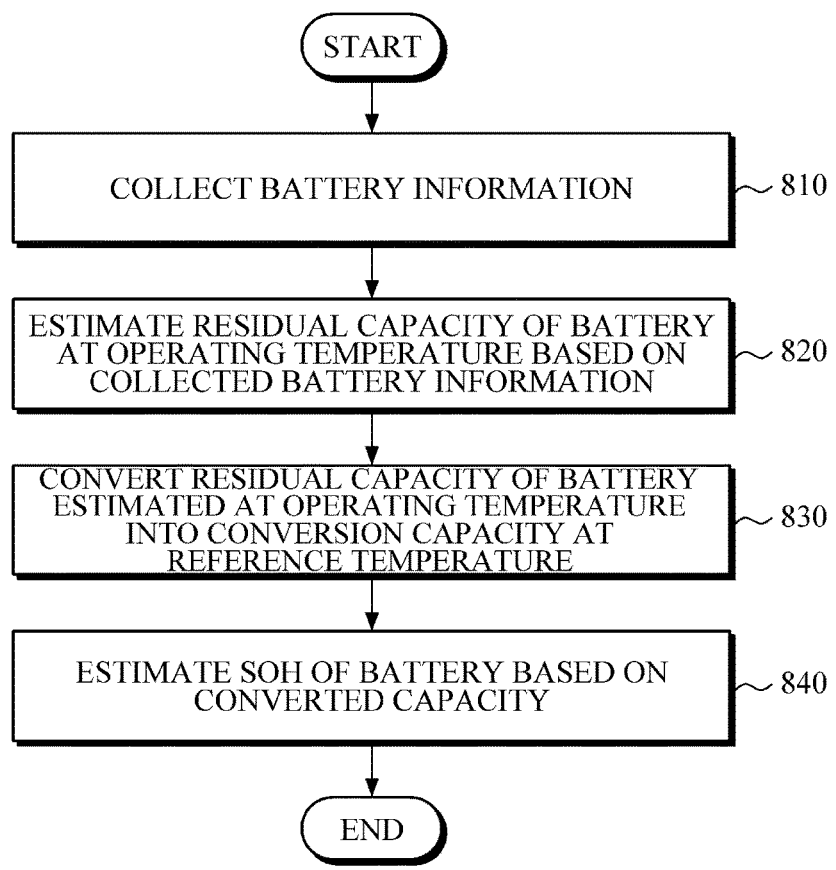
FIG. 8 is a diagram illustrating an example of a battery management method.

FIG. 8 is a diagram illustrating an example of a battery management method. With reference to FIGS. 1 and 8, a battery management method using the battery management apparatus 100 will be described. The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. In addition to the description of FIG. 8 below, the above descriptions of FIGS. 1-7, are also applicable to FIG. 8, and are incorporated herein by reference. Thus, the above description need not be fully repeated here.

In 810, the battery information collector 110 collects battery information. In an example, the battery information collector 110 collects information, such as, temperature, current, and voltage which are measured in a battery cell unit or a battery module unit.

When the battery information is collected, the pre-processor 120 performs pre-processing to clean the collected battery information. In the example, the pre-processor 120 eliminates noise from the battery information by providing, for example, a noise filter for eliminating noise. In an example, a pre-processing is performed to filter a section having a predetermined current rate (C-rate) range of temperature data sensed from a sensor. In an example, the pre-processor 120 selectively pre-processes data according to a characteristic of the collected battery information.

In 820, the capacity estimator 130 estimates a residual capacity of a battery at an operating temperature based on the collected battery information. For example, the capacity estimator 130 estimates a residual capacity (mAh) of the battery using battery charge/discharge data input through the battery information collector 110, the pre-processor 120, or the display 170.

In an example, the capacity estimator 130 determines any one or a combination of an average value, a median value, a maximum value, and a minimum value of a temperature measured in a cell unit or module unit of the battery as an operating temperature to estimate a residual capacity of the battery at the operating temperature.

As an example, when temperature data inside a battery is sensed at the battery information collector 110 and a section having a C-rate of a low rate is filtered at the pre-processor 120, the capacity estimator 130 determines an average value that is obtained by averaging the pre-processed temperature data as an operating temperature of the battery.

Unlike sensing data that senses the temperature data inside the battery, the battery operating temperature may be an average temperature in which sections that are temporarily raised or dropped in temperature are eliminated.

In 830, the capacity converter 140 converts the residual capacity of the battery estimated at the operating temperature into a capacity at a reference temperature. In an example, the capacity converter 140 converts the residual capacity of the battery estimated at the operating temperature into a residual capacity of the battery at the reference temperature using capacity conversion information per temperature.

In an example, the capacity conversion information per temperature is information in the form of any one or any combination of a conversion table, a conversion function, or a conversion graph, each of which represents a capacity conversion relation of a reference temperature compared to an operating temperature.

For example, the capacity conversion information per temperature may be conversion information matching a residual capacity of a battery estimated at a test temperature to a residual capacity estimated at another test temperature, which enables an estimation of a state of the battery having a residual capacity to be the same as that estimated at the test temperature.

As an example, when an SOH of a battery is estimated based on a battery capacity of 2600 mAh at an operating temperature of the battery of 25° C. and an SOH of a battery estimated based on a battery capacity of 2800 mAh at a temperature of 45° C. are the same as each other, the battery capacity of 2600 mAh at 25° C. and the battery capacity of 2800 mAh at 45° C. are matched to each other.

In 840, the SOH estimator 160 estimates an SOH of a battery based on the converted capacity. In an example, the SOH estimator 160 estimates an SOH of a battery using one or more among a data analysis method, such as an equivalent circuit based internal resistance estimation, and an internal resistance estimation algorithm using an open circuit voltage (OCV).

According to an embodiment, when a residual capacity of a battery estimated at an operating temperature of the battery is converted into a residual capacity of the battery at a reference temperature, even though operating temperatures between the plurality of battery cells are minutely different from each other, a residual capacity of each battery cell may be compared as a unified index. Also, the SOH of the battery is estimated by actually considering the operating temperature of the battery so that accuracy of an SOH estimation of the battery is improved.

The battery management apparatus 100, battery information collector 110, pre-processor 120, capacity estimator 130, capacity converter 140, capacity conversion information storage 150, and state of health (SOH) estimator 160 described in FIG. 1 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management apparatus, comprising:
a battery information collector, implemented by a processor or a computer, configured to collect battery information;
a capacity estimator, implemented by a processor or a computer, configured to estimate residual capacity of a battery at an operating temperature based on the collected battery information;
a capacity converter, implemented by a processor or a computer, configured to convert the estimated residual capacity of the battery into capacity of the battery at a reference temperature; and
a state of health (SOH) estimator, implemented by a processor or a computer, configured to estimate SOH of the battery based on the converted capacity.

2. The battery management apparatus of claim 1, wherein the battery information includes any one or any combination of a temperature, a current, and a voltage that are measured in a cell unit or a module unit of the battery.

3. The battery management apparatus of claim 2, wherein the capacity estimator is further configured to determine any one or any combination of an average value, a median value, a maximum value, and a minimum value of the temperature measured in the cell unit or the module unit of the battery as the operating temperature, and to estimate the residual capacity of the battery at the operating temperature.

4. The battery management apparatus of claim 1, wherein the capacity converter is further configured to convert the estimated residual capacity of the battery at the operating temperature into the residual capacity of the battery at the reference temperature using capacity conversion information per temperature.

5. The battery management apparatus of claim 4, wherein the capacity conversion information per temperature comprises any one or any combination of a conversion table, a conversion function, and a conversion graph, each representing a capacity conversion relation of the reference temperature as compared to the operating temperature.

6. The battery management apparatus of claim 1, further comprising:
a pre-processor configured to eliminate noise from the collected battery information.

7. The battery management apparatus of claim 6, wherein the pre-processor is further configured to selectively provide or exclude the collected battery information according to a state of the collected battery information.

8. The battery management apparatus of claim 5, wherein the capacity conversion information per temperature is learned in advance and stored in a capacity conversion information storage.

9. The battery management apparatus of claim 1, further comprising a memory configured to store instructions, and wherein the processor is further configured to execute the instructions to estimate the residual capacity of the battery at the operating temperature based on the battery information, to convert the estimated residual capacity of the battery into the capacity of the battery at a reference temperature, and to estimate the SOH of the battery based on the converted capacity.

10. A battery management method employing a capacity estimator implemented by a processor or a computer, a capacity converter implemented by a processor or a computer, and a state of health (SOH) estimator implemented by a processor or a computer, the method comprising:

estimating, using the capacity estimator, a residual capacity of a battery at an operating temperature based on collected battery information;

converting, using the capacity converter, the estimated residual capacity of the battery at the operating temperature into a capacity of the battery at a reference temperature; and estimating, using the SOH estimator, a state of health of the battery based on the converted capacity.

11. The battery management method of claim 10, wherein the battery information comprises any one or any combination of a temperature, a current, and a voltage that are measured in a cell unit or a module unit of the battery.

12. The battery management method of claim 11, wherein the estimating of the residual capacity of the battery comprises determining any one or any combination of an average value, a median value, a maximum value, and a minimum value of the temperature measured in the cell unit or the module unit of the battery as the operating temperature, and estimating the residual capacity of the battery at the operating temperature.

13. The battery management method of claim 10, wherein the converting of the estimated residual capacity comprises converting the estimated residual capacity of the battery at the operating temperature into the residual capacity of the battery at the reference temperature using capacity conversion information per temperature.

14. The battery management method of claim 10, wherein the capacity conversion information per temperature comprises any one or any combination of a conversion table, a conversion function, and a conversion graph, each representing a capacity conversion relation of the reference temperature as compared to the operating temperature.

15. The battery management method of claim 10, further comprising pre-processing to eliminate noise from the collected battery information.

16. The battery management method of claim 10, wherein the battery comprises battery cells and the estimating of the SOH of the battery comprises estimating the SOH of the battery based on estimating a SOH of each cell of the battery at a reference temperature.

17. A non-transitory computer-readable storage medium storing instructions that, when executed by a processor, cause the processor to perform the method of claim 10.

* * * * *